United States Patent [19]

Bartmann et al.

[11] Patent Number: 5,985,950
[45] Date of Patent: Nov. 16, 1999

[54] ACID-CURABLE BINDER SYSTEMS CONTAINING 1,2 DISULFONES

[75] Inventors: Ekkehard Bartmann, Erzhausen; Jörg Ohngemach, Reinheim, both of Germany

[73] Assignee: Ciba Specialty Chemicals Corporation, Tarrytown, N.Y.

[21] Appl. No.: 09/010,276

[22] Filed: Jan. 21, 1998

Related U.S. Application Data

[62] Division of application No. 07/938,563, Aug. 28, 1992, Pat. No. 5,717,003, which is a continuation of application No. 07/469,599, filed as application No. PCT/EP89/00880, Jul. 26, 1989, abandoned.

[30] Foreign Application Priority Data

Aug. 3, 1988 [DE] Germany .............................. P38263637

[51] Int. Cl.$^6$ ................................ C08J 3/28; C08L 33/08; C08L 33/10
[52] U.S. Cl. ................................ 522/59; 522/27; 522/126; 528/332; 528/391; 528/392; 528/423; 525/217; 525/227
[58] Field of Search ................................ 522/59, 27, 126; 528/289, 392, 423, 391, 332; 525/217, 227

[56] References Cited

U.S. PATENT DOCUMENTS

| | | |
|---|---|---|
| 3,264,203 | 8/1966 | Atchison .................................... 522/59 |
| 4,351,708 | 9/1982 | Berner et al. ....................... 204/159.23 |
| 4,552,830 | 11/1985 | Reardon ..................................... 522/45 |
| 4,690,957 | 9/1987 | Fujioka ..................................... 522/31 |
| 4,766,037 | 8/1988 | Watanabe ............................. 428/321.5 |
| 4,980,268 | 12/1990 | Bartmann et al. ....................... 430/283 |

FOREIGN PATENT DOCUMENTS

| | | |
|---|---|---|
| 192967 | 9/1986 | European Pat. Off. . |
| 58-83844 | 5/1983 | Japan . |
| 59-197422 | 11/1984 | Japan . |

OTHER PUBLICATIONS

Tsunooka, "Photocrosslinking . . . ", Makromol. Chem., Rapid Commun. vol. 4, pp. 539–541 (1983).

Kobayashi "Photolysis . . . ". Bull. Chem.Soc.Japan, vol. 45, pp. 2906–2909 (1972).

Chemical Abstract #101:63684a to Fuji.

Chemical Abstract #102:186028 to Arakawa.

PTO translation of J 58–083844, May 1983.

Chem. Abstr. 102:186029, 1985.

Chem. Abstr. 99:140979v, vol. 99, 1983.

*Primary Examiner*—Susan W. Berman
*Attorney, Agent, or Firm*—Luther A. R. Hall; David R. Crichton

[57] ABSTRACT

1,2-Disulfones are particularly suitable as thermally and photochemically activatable latent acid catalysts for binder systems which contain at least one acid-curable component.

6 Claims, No Drawings

ACID-CURABLE BINDER SYSTEMS CONTAINING 1,2 DISULFONES

This is a divisional of application Ser. No. 07/938,563, filed on Aug. 28, 1992, now U.S. Pat. No. 5,717,003, issued on Feb. 10, 1998, which is a continuation of application Ser. No. 07/469,599, filed on Apr. 3, 1990, now abandoned, which was filed in the United States as PCT/EP89/00880 on Jul. 26, 1989.

The invention relates to acid-curable binder systems which contain 1,2-disulfones as thermally and photochemically activatable acid catalysts.

A large proportion of binder systems in paint and coating technology is based on heat-curing materials in which cross-linking, and consequently curing, results from polycondensation. In these systems, polycondensable bases are usually aminoplastic synthetic resins whose heat-curing is catalyzed by acids, in particular organic sulfonic acids. A typical and very frequently used acid catalyst is p-toluenesulfonic acid (PTS). However, acid-curable systems have the disadvantage that, once the acid catalyst has been added, they have only a limited shelf life and soon gel if they are not processed within a relatively short time. Sulfonic acid catalysts in "blocked" form, for example in the form of amino salts or oxime esters of hydroxamic acids, give a longer shelf life. It is possible to release the catalytically active acids by heating these blocked forms to elevated temperatures. However, curing of the said systems by this method requires a larger expenditure of energy.

In paint and coating technology, besides heat curing, photochemically induced curing has achieved great importance, this involving the use of specific radiation-curable compositions which contain photoactivators or photoinitiators to convert the radiant energy. Particular features of radiation curing are a high cure rate and a low energy consumption. For practical purposes, the most important photopolymerization is the free-radical poly-addition of ethylenic double bonds. Suitable radiation-curing systems are therefore based on materials which contain free-radical-polymerizable or crosslinkable ethylenic double bonds and on free-radical-forming photoinitiators.

In principle, acid-catalyzed heat-curing systems can also be radiation-cured if, instead of the customary acid catalysts, photochemically activatable latent acid catalysts are used. It is essential that the effect of radiation releases the catalytically active acid which brings about the actual cure, preferably promoted by the additional input of heat energy. The compounds of the halo- or sulfonyloxy-acetophenone types which have long been known for this purpose have the disadvantage of being corrosive, of yellowing the cured coatings or having other deleterious effects; furthermore, these types of compound cause stability problems and compatibility problems.

More recent attempts to reduce the known disadvantages of acid-catalyzed heat-curing systems and to impart to them the advantages of photochemical activation by UV-radiation are reflected for example in EP-192,967. This discloses sulfonyl derivatives of aromatic-aliphatic ketones, in particular α-sulfonylacetophenone compounds, which can be used as photochemically activatable latent acid catalysts. These compounds are said to have improved properties in use, particularly regarding the effects on the cured coating and the shelf life of the binder system, in comparison with prior-art UV-acid catalysts. Moreover, these compounds can be used as free-radical-forming photoinitiators for free-radical-polymerizable binder systems and also for hybrid binder systems based on free-radical-curing and acid-curing components.

However, the compounds disclosed in EP-192,967 have the disadvantage that, owing to particular heat stability, they are not solely activatable by the action of heat. The value of the said compounds is diminished for practical purposes in that their utility is limited by the requirement in every case for photochemical activation. Such binder systems and curing processes must be suitable or designed for photochemical curing.

The prior art therefore provides no substances which are suitable both for curing acid-curable binder systems by purely thermal means and by photochemical means.

The object of the invention is therefore to provide compounds which are suitable as latent acid catalysts for acid-curable binder systems and which are activatable not only purely thermally but also photochemically.

Surprisingly, it has now been found that 1,2-disulfone compounds of the formula I

$$R^1\text{---}SO_2\text{---}SO_2\text{---}R^2 \qquad (I)$$

in which $R^1$ and $R^2$ may be identical or different and are alkyl, cycloalkyl, aryl, aralkyl or heteroaryl having up to 12 carbon atoms, optionally monosubstituted or polysubstituted by halogen, cyano, nitro, alkyl, alkoxy, alkylthio, mono- or bis-alkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl, each having up to 6 carbon atoms, are suitable as thermally and photochemically activatable latent acid catalysts in binder systems which contain at least one acid-curable component. These compounds allow acid-curable binder systems to be cured not only thermally but also photochemically and furthermore also by a combination of thermal and photochemical curing. At the same time, these compounds are in principle suitable for use with all binder systems which contain at least one acid-curable component. This means that they are also suitable for hybrid binder systems which additionally contain other components, in particular free-radical polymerizable components. A further advantage of 1,2-disulfone compounds is that their preparation is very simple and consequently extremely economical.

The present invention accordingly provides the use of compounds of the formula I as thermally and photochemically activatable latent acid catalysts in binders which contain at least one acid-curable component.

The invention furthermore provides a process for the curing of acid-curable binder systems, where to these systems is added an effective amount of at least one compound of the formula I and curing is carried out by irradiation with UV light of a wavelength of between 200 and 450 nm, by heating or by a combination of irradiation and heating.

The invention also provides curable binder systems which contain at least one compound of the formula I and in particular those systems which additionally contain free-radical-polymerizable components.

The 1,2-disulfone compounds of the formula I which are to be used according to the invention are mostly known per se. Furthermore, it is also known that some 1,2-diaryl disulfones are radiation-sensitive. For instance, Bull. Chem. Soc. Jap. 45, 2906 (1972) (CA 78: 15196c) discloses that diaryl disulfones are photo-sensitive and decompose into free radicals by the action of radiation. According to JP 58/83,844 (CA 101: 63684a), compounds of this type are used as free-radical-formers in light-sensitive compositions for photolithographic purposes. However, the systems described in the above patent are used merely to initiate a colour reaction so as to produce a visual contrast between irradiated and non-irradiated fields in the coating. The photo-structuring of the coating in every case requires the presence of other radiation-sensitive compounds. According to Macromol. Chem., Rapid Commun. 4, 539 (1983) (CA 99: 140979v) and JP 59/197,422 (CA 102: 186029u) diaryl disulfones can be used as radiation-crosslinking agents for epoxidized acrylate polymers, an acid mechanism being assumed.

However, it is not possible to conclude from the prior art that these compounds and moreover 1,2-disulfones of a far greater variety of structures are particularly suitable as not only thermally but also photochemically activatable latent acid catalysts for acid-curable binder systems. In particular, the thermal activatability was unforeseeable since the compounds of the formula I predominantly have very high melting points and decomposition temperatures.

In formula I, the substituents $R^1$ and $R^2$ may be identical or different and may denote alkyl, cycloalkyl, aryl, aralkyl or heteroalkyl having up to 12 carbon atoms, optionally monosubstituted or polysubstituted by halogen, cyano, nitro, alkyl, alkoxy, alkylthio, mono- or bis-alkylamino, alkanoyl, alkanoyloxy, alkanoylamido, alkoxycarbonyl, alkylaminocarbonyl, alkylsulfoxy, alkylsulfonyl, aryloxy, arylthio, arylsulfoxy or arylsulfonyl, each having up to 6 carbon atoms.

Examples of preferred radicals $R^1$ and $R^2$ are methyl, ethyl, n- and iso-propyl, cyclohexyl, phenyl, benzyl, pyridyl, naphthyl, tolyl, anisyl, 2,4,6-trimethylphenyl, 4-isopropylphenyl, chlorophenyl, bromophenyl and nitrophenyl.

In principle, the compounds of the formula I can all be prepared by processes which have already been described in the literature for preparing 1,2-disulfones. According to the German Patent Application P 38 04 316, a preferred synthesis was to oxidize 1,2-disulfonylhydrazines, which are readily accessible by reacting hydrazine with sulfonyl chlorides, with concentrated nitric acid as the oxidizing agent, to form 1,2-disulfones of the formula I. This method of synthesis is very easy, gives good yields and provides access to virtually any combination of the substituents $R^1$ and $R^2$.

Preference is given to the use of symmetrical and in particular asymmetrical 1,2-disulfone compounds of the formula I in which $R^1$ and $R^2$ represent phenyl, methylmethoxy- or isopropyl-substituted phenyl, naphthyl or $C_{1-3}$-alkyl. Particular examples of compounds of this type are 1,2-diphenyl disulfone, 1-(4-methylphenyl)-2-phenyl disulfone, 1-(4-methoxyphenyl)-2-phenyl disulfone, 1-(4-isopropylphenyl)-2-phenyl disulfone, 1-(4-isopropylphenyl)-2-(4-methylphenyl) disulfone, 1-(1-naphthyl)-2-phenyl disulfone, 1-(4-methylphenyl)-2-methyl disulfone, 1,2-di-n-propyl disulfone, and 1-(4-methoxyphenyl)-2-n-propyl disulfone.

The compounds of the formula I can be used according to the invention as thermally and photochemically activatable latent acid catalysts for acid-curable binder systems. With these systems, the heat activation is carried out within the customary range for acid-catalyzed heat-curing systems. This is between about 80 and 150° C., preferably between 100 and 120° C. Depending on the nature of the substituents $R^1$ and $R^2$, the photochemical activation can be carried out in a wavelength range of about 200–450 nm. Compounds of the formula I in which the substituents $R^1$ and $R^2$ represent phenyl or a low-substituted phenyl are particularly effective especially in the low to middle UV range, for example between 200 and 300 nm. The use of cosensitizers of a known type which absorb in regions of longer wavelength, for example aromatic ketones, can if necessary or if desired increase the sensitivity in the near UV range. The compounds of the formula I are not only effective in heat activation but also in photochemical activation if they are present in the binder systems in a proportion of 0.1–20% by weight. Their proportion is preferably between 1 and 10% by weight. Use of the said compounds in a proportion of about 2% by weight is particularly preferable and economical.

Acid-curable binder systems which are the field of application according to the invention of the compounds of the formula I are all those systems which contain at least one component capable of acid-catalyzed polycondensation. These are predominantly melamine- or urea-based synthetic resin materials which can also be modified in many ways. These materials are familiar to those skilled in the art; they are produced industrially in large quantities with modifications to their material properties as appropriate for a great number of applications. A typical example of a melamine-based material is hexamethoxymethylmelamine. Furthermore, the acid-curable binder system may contain any other components in different proportions as customary in aminoplastics, for example alkyd resins, phenolic resins, polyester resins, acrylic resins, polyvinyl resins and mixtures thereof.

The compounds of the formula I are suitable as curing catalysts particularly also in the case of hybrid binder systems which contain components which are capable of acid-catalyzed polycondensation and also components which are capable of free-radical-polymerization. In these systems, the disulfones of the formula I are activated according to the invention purely photochemically and preferably by a combination of photochemical and thermal means and they function equally as free-radical-formers and acid-generators and consequently bring about the curing of the different hybrid system components virtually simultaneously. Suitable acid-curable components for hybrid systems of this type are all those materials already listed above. Suitable free-radical-polymerizable components are virtually all materials which contain olefinically saturated double bonds. In particular these may be monomers, oligomers and polymers each having at least one or preferably several unsaturated functional groups of the acrylate or vinyl type. Such materials are known in great number to those skilled in the art from the field of free-radical polymerization and in particular from the technology of radiation curing with the aid of free-radical-forming photoinitiators. The proportion of acid-curable and free-radical-polymerizable components in hybrid binder systems of this type may vary within wide limits, for example, each may vary between 10 and 90% by weight.

Whether based on a purely acid-curable composition or on a hybrid composition, the binder systems which are curable using compounds of the formula I as catalysts can have compositions which vary qualitatively and quantitatively within wide limits and the said systems may in particular also contain other components and additives. Preferably, the proportion of reactive components in the said systems should not be less than 10% by weight. Other components and additives which may be present in appropriate and customary amounts for the particular purpose are inorganic and organic pigments, dyes, fillers, flow control agents, surface-active agents, light stabilizers and antioxidants, thixotropic agents, flatting agents, plasticizers, other binders and resins, radiation sensitizers and coinitiators, other heat- or photo-sensitive free-radical initiators and also cation- or acid-forming catalysts.

The said binder systems can be cured according to the invention in different ways using compounds of the formula I, i.e. purely thermally, photochemically and by a combination of photochemical and thermal curing. In purely thermal curing, the disulfones of the formula I have a performance virtually identical with that of the known thermal acid catalysts, such as p-toluenesulfonic acid and derivatives thereof with regard to the coating hardnesses which are achievable. Further, in comparison with the known compounds, the said compounds of the formula I have the additional advantage of also being photochemically activatable. Moreover, they are considerably superior to the known thermal acid catalysts with regard to the shelf life of the binder systems to which catalysts have been added. Neither do the said compounds of the formula I have any tendency to impair the cured end product, in particular by yellowing it.

Photochemical activation using the disulfones of the formula I is advantageously carried out using simultaneous or subsequent heat treatment to promote curing or postcuring, the heat treatment being applied in the same manner as with purely thermal curing. The coating hardnesses which are achievable by this method are equal to those obtained using purely thermal curing with the known acid catalysts. The achievable coating hardnesses are likewise equal to those which can be achieved using the α-sulfonylacetophenones disclosed in EP 192,967. However, the α-sulfonylacetophenones, being latent acid catalysts activatable only by photochemical means, cannot be used in purely thermal curing processes.

The 1,2-disulfones of the formula 1 used according to the invention as thermally and photochemically-activatable latent acid catalysts quite generally extend the selection of curing catalysts for binder systems based on components which are capable of acid-catalyzed polycondensation. In comparison with prior-art curing catalysts, the compounds of the formula I have the particular advantage of wider applicability i.e. they can equally well be used in purely thermal processes or in photochemical processes. Furthermore,. the said compounds of the formula I are of particular value in practice owing to their ready and consequently economical availability and their advantageous properties in use.

EXAMPLES

A. General directions for preparing 1,2-disulfones of the formula $R^1$—$SO_2$—$SO_2$—$R^2$ (I)

Concentrated nitric acid (specific gravity 1.4) is added dropwise with stirring and ice cooling to the appropriate 1,2-disulfonylhydrazine compound. After a few minutes, the reaction commences with the evolution of nitrogen. After the reaction has subsided, stirring is continued for about 1 hour at 0° C., and the precipitate which has been formed is separated off and purified by recrystallization.

B. Compounds prepared

| No. | $R^1$ | $R^2$ | Recrystallized from | Melting point (° C.) |
|---|---|---|---|---|
| 1 | Phenyl | Phenyl | Ethanol | 192 |
| 2 | " | 4-Methylphenyl | Methanol | 177 |
| 3 | " | 4-Methoxyphenyl | Acetone | 153 |
| 4 | " | 2-Naphthyl | Methyl t-butyl ether | 182 |
| 5 | " | Benzyl | Methyl t-butyl ether/Acetone | 186 |
| 6* | " | 2-Nitro-3,5-dimethoxyphenyl | Acetone | 186 |
| 7 | " | 2,4,6-Trimethylphenyl | Toluene | 154 |
| 8 | " | 4-i-Propylphenyl | Glacial acetic acid | 92 |
| 9 | " | 4-Chlorophenyl | Toluene | 181 |
| 10 | " | 4-Bromophenyl | Acetone | 198 |
| 11 | 4-Methylphenyl | 4-Methylphenyl | Acetone/Ether | 222 |
| 12 | " | 4-Chlorophenyl | Toluene | 206 |
| 13 | " | Benzyl | Methanol | 126 |
| 14 | " | 4-t-Butylphenyl | Glacial acetic acid | 162 |
| 15 | 4-Methylphenyl | 2-Naphthyl | Methyl t-butyl ether/Dichloromethane | 186 |
| 16 | " | 4-Methoxyphenyl | Acetone | 173 |
| 17* | " | 2-Nitro-3,5-dimethoxyphenyl | Acetone | 182 |
| 18 | " | Methyl | Methyl t-butyl ether | 109 |
| 19 | " | 1-Naphthyl | Acetone | 201 |
| 20 | 1-Naphthyl | 1-Naphthyl | Acetone/DMF | 183 (Decomposition) |
| 21 | 2-Naphthyl | 2-Naphthyl | THF | 226 (Decomposition) |
| 22 | 4-Methoxyphenyl | 4-Methoxyphenyl | Acetone | 194 (Decomposition) |
| 23 | 4-Nitrophenyl | 4-Nitrophenyl | THF | 224 (Decomposition) |
| 24 | 2-Methylphenyl | 2-Methylphenyl | Toluene | 160 |
| 25 | Benzyl | Benzyl | Glacial acetic acid | 183 (Decomposition) |
| 26 | Benzyl | n-Propyl | Dichloromethane/n-Pentane | 100 |
| 27 | n-Propyl | n-Propyl | (Water)** | 53 |
| 28 | n-Propyl | 4-Nitrophenyl | Methyl t-butyl ether | 111 |
| 29 | n-Propyl | 4-Methoxyphenyl | Petroleum ether | 83 |
| 30 | Phenyl | n-Propyl | Methyl t-butyl ether | 138 |
| 31 | " | 4-t-Butylphenyl | (Water)** | 128 |
| 32 | 4-Methylphenyl | n-Propyl | (Water)** | 86 |
| 33 | 4-i-Propylphenyl | Methyl | — | (oil) |
| 34 | 4-t-Butylphenyl | n-Propyl | Ether/Petroleum ether | 110 |
| 35 | 1-Naphthyl | Methyl | Toluene | 157 |
| 36 | 1-Naphthyl | n-Propyl | (Water)** | 116 |
| 37 | 2-Naphthyl | Methyl | (Water)** | 146 |
| 38 | 2-Naphthyl | n-Propyl | Ether/Petroleum ether | 67 |
| 39 | 4-Acetylamidophenyl | n-Propyl | Glacial acetic acid | 189 |
| 40 | 4-Acetylamidophenyl | Phenyl | Glacial acetic acid | 208 |

-continued

| No. | R¹ | R² | Recrystallized from | Melting point (° C.) |
|---|---|---|---|---|
| 41 | 4-Acetylamidophenyl | 4-Methylphenyl | Glacial acetic acid | 201 |
| 42 | 4-Acetylamidophenyl | 4-Methoxyphenyl | Glacial acetic acid | 204 |
| 43 | 4-Acetylamidophenyl | 4-Nitrophenyl | Glacial acetic acid | 198 (Decomposition) |
| 44 | 4-Phthalimidophenyl | n-Propyl | Glacial acetic acid | 196 |
| 45 | 4-Phthalimidophenyl | Phenyl | Dichloromethane/ Cyclohexane | 210 |
| 46 | 4-Phthalimidophenyl | 4-Methylphenyl | Glacial acetic acid | 214 |
| 47 | 4-Phthalimidophenyl | 4-Methoxyphenyl | Glacial acetic acid | 162 |
| 48 | 4-(1,2-Dimethylmaleimido)phenyl | n-Propyl | Methyl t-butyl ether | 143 |
| 49 | 4-(1,2-Dimethylmaleimido)phenyl | Phenyl | Dichloromethane | 222 |
| 50 | 4-(1,2-Dimethylmaleimido)phenyl | 4-Methylphenyl | Dichloromethane/ Petroleum ether | 235 |
| 51 | 4-(1,2-Dimethylmaleimido)phenyl | 4-Methoxyphenyl | Glacial acetic acid | 162 |
| 52 | 4-Nitrophenyl | n-Propyl | Ether | 104 |

*In this case, the NO₂ group is introduced during the oxidation with nitric acid.
**The addition of water is sufficient to give crystals of adequate purity.

C. Comparative Testing in Use

The compounds of the formula I (according to the invention) which were to be tested and prior-art comparative substances were uniformly admixed with stirring in the form of 10% solutions in n-butanol with samples of an acid-curable coating system composed of 10 parts by weight of hexamethoxymethylmelamine (Cymel 303, from Dyno Cyanamid)

90 parts by weight of a carboxylate polyacrylate resin (Luprenal LR 8491, from BASF)

The ready-to-use coating samples were then applied to glass sheets (10×10 cm) in a layer thickness of 80 μm and ventilated to remove the solvent.

The following were used as comparative substances:

p-toluenesulfonic acid monohydrate⁺⁾ (PTS)

2-phenylsulfonyl-2-methylpropiophenone⁺⁺⁾ (V1)

2-(4-methylsulfonyl)-2-methylpropiophenone⁺⁺⁾ (V2)

2-(4-methylsulfonyl)-2-methyl-(4'-methylthio) propiophenone⁺⁺⁾ (V3)

⁺⁾ commercially available thermal acid catalyst ⁺⁺⁾ acid catalysts according to EP 192,967

Test 1
Heat Curing

The coated sheets were cured for 30 minutes at 120° C. After cooling, the König pendulum hardness (DIN 53157) was used as a measure of the hardness produced. The results are shown in Table 1.

TABLE 1

| Substance | Substance concentration | Pendulum hardness (seconds) |
|---|---|---|
| No. 8 | 2 % by wt. | 154 |
| PTS | 2 % by wt. | 171 |
| V1 | 2 % by wt. | 116 |
| V2 | 2 % by wt. | 137 |
| V3 | 2 % by wt. | 113 |
| none | | 145 |

This shows that the substance according to the invention brings about a good hardness which is only exceeded by PTS. In contrast, the comparative substances V1–V3 are not heat-activatable. On the contrary, their presence reduces the coating hardness relative to the uncatalyzed system.

Test 2
Combination of Photochemical and Thermal Curing

The coated sheets were initially passed on a conveyor belt at a speed of 5 m/min and at a distance of 10 cm beneath a medium-pressure UV lamp having an output of 80 W/cm. After the irradiation, the surfaces were still tacky. Then thermal post-curing was carried out for 30 minutes at 120° C. Table 2 gives the hardness results (König pendulum hardness).

TABLE 2

| Substance | Substance concentration | Pendulum hardness (seconds) |
|---|---|---|
| No. 3 | 2 % by wt. | 158 |
| No. 4 | 2 % by wt. | 148 |
| No. 8 | 2 % by wt. | 170 |
| No. 14 | 2 % by wt. | 167 |
| PTS | 2 % by wt. | 165 |
| V1 | 2 % by wt. | 172 |
| V2 | 2 % by wt. | 167 |
| V3 | 1 % by wt. | 148 |

Using the substances according to the invention, favorable coating hardnesses are achieved which are for practical purposes unsurpassed by the comparative substances.

We claim:

1. A process for curing an acid-curable binder system, which comprises
adding to said system an effective amount of at least one compound of formula I

$$R^1-SO_2-SO_2-R^2 \qquad (I)$$

wherein $R^1$ and $R^2$ are identical or different and are alkyl, cycloalkyl, aryl, aralkyl or heteroaryl having up to 12 carbon atoms, optionally monosubstituted or polysubstituted by halogen, cyano, nitro, alkyl, alkoxy, alkylthio, mono- or bis-alkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl, each having up to 6 carbon atoms, and heating said system to a temperature sufficient to effect curing in the absence of ultraviolet irradiation.

2. A process according to claim 1, wherein the compound(s) of formula I is/are added in a proportion of 0.1 to 20% by weight.

3. A process for curing a hybrid binder system containing an acid-curable component and a component cured by free-radical initiated cross-linking, which comprises adding to said system an effective amount of at least one compound of formula I $$R^1\text{—}SO_2\text{—}SO_2\text{—}R^2 \qquad (I)$$

wherein $R^1$ and $R^2$ are identical or different and are alkyl, cycloalkyl, aryl, aralkyl or heteroaryl having up to 12 carbon atoms, optionally monosubstituted or polysubstituted by halogen, cyano, nitro, alkyl, alkoxy, alkylthio, mono- or bis-alkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl, each having up to 6 carbon atoms, and heating said system to a temperature sufficient to effect curing in the absence of ultraviolet irradiation.

4. A process according to claim 3, wherein the compound(s) of formula I is/are added in a proportion of 0.1 to 20% by weight.

5. A process for curing an acid-curable binder system, which comprises adding an effective amount of at least one compound of formula I $$R^1\text{—}SO_2\text{—}SO_2\text{—}R^2 \qquad (I)$$

wherein $R^1$ and $R^2$ are identical or different and are alkyl, cycloalkyl, aryl, aralkyl or heteroaryl having up to 12 carbon atoms, optionally monosubstituted or polysubstituted by halogen, cyano, nitro, alkyl, alkoxy, alkylthio, mono- or bis-alkylamino, alkanoyl, acyloxy, acylamido, alkoxycarbonyl, alkylaminocarbonyl, alkylsulfoxy, alkylsulfonyl, aryloxy, arylthio, arylsulfoxy or arylsulfonyl, each having up to 6 carbon atoms, and heating said system to a temperature sufficient to effect curing and, optionally, irradiating said system with ultraviolet light.

6. A process according to claim 5, characterized in that the compound(s) of formula I is/are added in a proportion of 0.1 to 10% by weight.

\* \* \* \* \*